(12) United States Patent
Hattori et al.

(10) Patent No.: US 9,019,723 B2
(45) Date of Patent: Apr. 28, 2015

(54) ELECTRICAL JUNCTION BOX

(71) Applicant: Sumitomo Wiring Systems, Ltd., Yokkaichi, Mie (JP)

(72) Inventors: Yuuichi Hattori, Yokkaichi (JP); Akihiro Oda, Yokkaichi (JP)

(73) Assignee: Sumitomo Wiring Systems, Ltd. (JP)

( * ) Notice: Subject to any disclaimer, the term of this patent is extended or adjusted under 35 U.S.C. 154(b) by 184 days.

(21) Appl. No.: 13/890,355

(22) Filed: May 9, 2013

(65) Prior Publication Data
US 2013/0343031 A1 Dec. 26, 2013

(30) Foreign Application Priority Data
Jun. 20, 2012 (JP) ................. 2012-138890

(51) Int. Cl.
*H01H 85/20* (2006.01)
*H02B 1/18* (2006.01)
*H05K 5/00* (2006.01)
*B60R 16/023* (2006.01)

(52) U.S. Cl.
CPC .......... *H05K 5/0004* (2013.01); *B60R 16/0238* (2013.01)

(58) Field of Classification Search
USPC .................. 361/823, 824, 833, 834; 439/76.2
See application file for complete search history.

(56) References Cited

U.S. PATENT DOCUMENTS 7,927,111 B2 4/2011 Kita
8,297,988 B2 * 10/2012 Sugiura et al. ............... 439/76.2

* cited by examiner

*Primary Examiner* — Ramon Barrera
(74) *Attorney, Agent, or Firm* — Gerald E. Hespos; Michael J. Porco; Matthew T. Hespos

(57) ABSTRACT

An electrical junction box has fuse attachment portions arranged side by side and open to a lateral side of a box body. Recesses (88) are formed at opposite side edges of an L-shaped bend (78) of each of connecting terminals (48a-48c), and in a terminal support block (42) in which a plurality of terminal insertion holes (54a) to (54c) are formed and support pins (74) that lock the connecting terminals (48a) to (48c) are inserted, temporal retaining portions (68) are formed in respective opening ends (70) of the terminal insertion holes (54a-54c) on a terminal insertion side, the temporal retaining portions (68) temporarily positioning the connecting terminals (48a) to (48c) within the respective terminal insertion holes (54a-54c) by the recesses (88) of the connecting terminals (48a) to (48c) being fit into the temporal retaining portions (68).

7 Claims, 8 Drawing Sheets

ELECTRICAL JUNCTION BOX

BACKGROUND

1. Field of the Invention

The invention relates to an electrical junction box equipped with a plurality of fuse attachment portions, and particularly relates to an electrical junction box in which a plurality of fuse attachment portions are arranged side by side and open to a lateral side of a box body.

2. Description of the Related Art

Electrical junction boxes, such as junction boxes in automobiles and the like are equipped with a large number of fuse attachment portions to which fuses are attached for preventing an overcurrent from flowing to various electrical components. U.S. Pat. No. 7,927,111 discloses an electrical junction box in which fuse attachment portions are arranged side by side and open to a lateral side of a box body to enable a large number of fuses to be attached with high space efficiency.

The connecting terminals of the electrical junction box of U.S. Pat. No. 7,927,111 have an L-shaped bent portion to enable the fuses to be attached from the lateral side of the box body. The connecting terminals with the L-shaped bend are inserted into and supported by respective terminal insertion holes in a terminal support block so that connecting portions to which the respective fuses are connected extend laterally from the box body.

Fuses of the electrical junction box shown in U.S. Pat. No. 7,927,111 are inserted from the side of the box body and push the connecting terminals during the connection process. Thus, the connecting terminals may move backward and may not be connected stably to the fuses. FIG. 4 of U.S. Pat. No. 7,927,111 addresses this issue by inserting support pins into the terminal support block. The support pins engage the connecting terminals perpendicularly to the connecting terminals, and support the connecting terminals against a pushing force that exerted during insertion of the fuses.

A large number of connecting terminals are supported in the terminal support block and each must be engaged by a support pin. Accordingly, during insertion of the support pins into the terminal support block, it is necessary that all of the connecting terminals are inserted correctly into the terminal support block, and thus there has been a problem that much time and effort is required for assembly.

The invention was made in view of the above-described circumstances, and it is an object thereof to provide an electrical junction box having a novel structure that enables a plurality of fuse attachment portions that are arranged side by side and open to a lateral side of a box body to be formed with a narrow pitch while securing the ease of assembly of connecting terminals.

SUMMARY OF THE INVENTION

The invention relates to an electrical junction box with a box body and fuse attachment portions. The fuse attachment portions are arranged side by side and open to a lateral side of the box body. L-shaped connecting terminals are disposed in the respective fuse attachment portions. The connecting terminals are inserted into terminal insertion holes in a terminal support block and are arranged side by side. Support pins are inserted into the terminal support block perpendicular to the connecting terminals and function to lock and position the connecting terminals in the terminal insertion holes. Recesses are formed at opposite side edges of each of the connecting terminals and extend on both sides of the L-shaped bend in a length direction. A temporal retaining portion is formed in an opening end of each terminal insertion hole on a side on which the corresponding connecting terminal is inserted. The recesses of the connecting terminal fit in the temporal retaining portion for temporarily positioning the connecting terminal within the terminal insertion hole until the support pins can be inserted into the terminal support block. Thus, the support pins can be inserted smoothly into the terminal support block to improve the ease of assembly even if a large number of connecting terminals are inserted into the respective terminal insertion holes of the terminal support block.

Each connecting terminal can be positioned temporarily at the bend at the rear end in the direction of insertion into the corresponding terminal insertion hole. Thus, a protrusion is not necessary in a region extending forward from the bent portion in the insertion direction for temporal positioning within the terminal insertion holes. Accordingly, a portion of each connecting terminal that is inserted into the terminal insertion hole need not be wider. As a result, the connecting terminals can be arranged with a narrow pitch, and the fuse attachment portions can be formed with a narrow pitch. The L-shape of the connecting terminals contributes to an increased rigidity, and hence the connecting terminals are strong despite the presence of the recesses. Furthermore, each connecting terminal is positioned temporarily at the bend, which has relatively high rigidity. Hence, the accuracy of temporal positioning is good, and the risk that the connecting terminals may deform during assembly is reduced.

A pulling force is exerted on the connecting terminals during removal of fuses from the connecting terminals. However, the terminal support block preferably locks an inner surface of the bend of each of connecting terminal preferably and supports the respective connecting terminals. Thus, the fuses can be removed more stably, and cracks are not likely to occur in soldered connections of the connecting terminals to the printed circuit board.

A rear end face of the connecting terminals in a direction of insertion into the terminal insertion holes preferably is flush with an opening end face of the terminal insertion holes when the connecting terminals are inserted properly into the respective terminal insertion holes of the terminal support block. Accordingly, any connecting terminal that is not temporarily positioned properly in the corresponding terminal insertion hole will protrude from the opening end face of the terminal insertion hole. Accordingly, the temporarily positioned state of a connecting terminal can be checked easily by visual inspecting whether any connecting terminal protrudes from the opening end face of the terminal insertion hole. Thus, the inserted state of even a large number of connecting terminals can be checked easily and quickly by visual inspection.

The recesses are at opposite side edges of the bend of each L-shaped connecting terminal, and the temporal retaining portions are formed in the opening ends of the respective terminal insertion holes on the terminal insertion side. The recesses of the connecting terminals fit to the temporal retaining portions for temporarily positioning the connecting terminals in the respective terminal insertion holes. Thus, the support pins can be inserted easily into even a large number of the temporarily positioned connecting terminals, thereby improving the ease of assembly. Moreover, the connecting terminals are positioned temporarily at their respective bends, and a protrusion or the like for positioning in a region forward from the bend in the insertion direction is not needed. Therefore, the connecting terminals can be narrower. As a result, the connecting terminals can be arranged with a narrow pitch, and the fuse attachment portions can be formed with a narrow pitch.

DETAILED DESCRIPTION OF THE PREFERRED EMBODIMENTS

Figure 1:
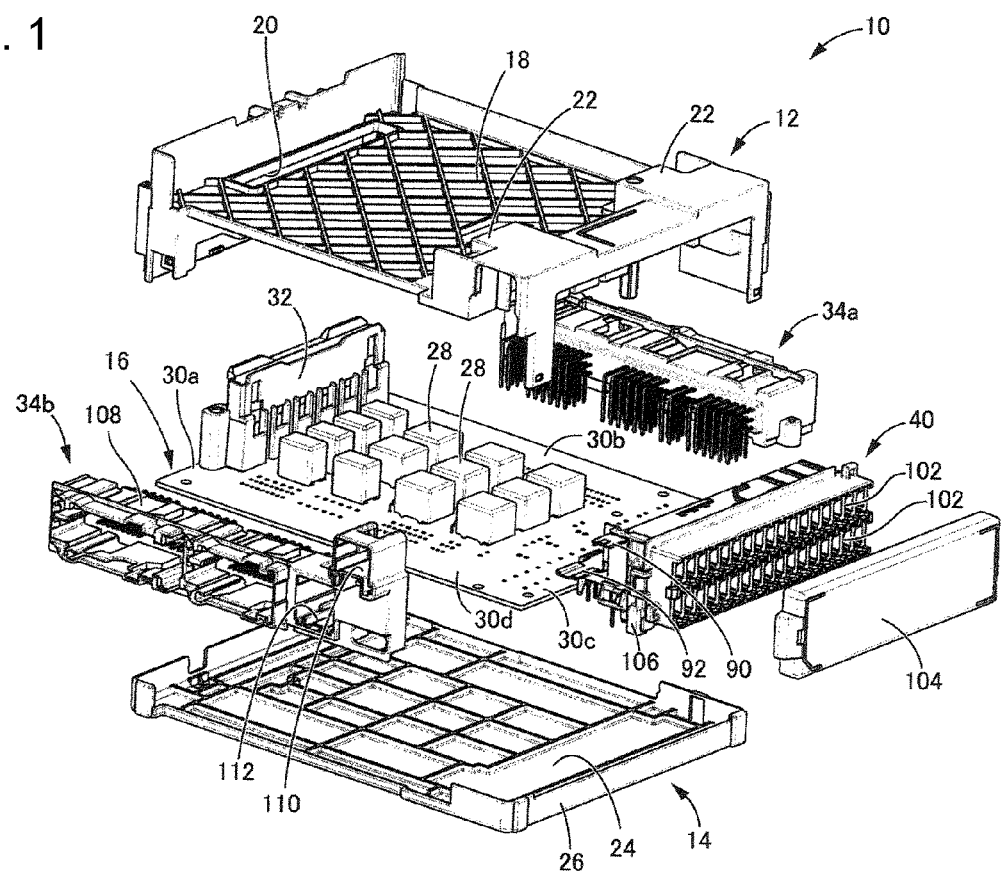
FIG. 1 is an exploded perspective view of an electrical junction box of an embodiment of the invention.

FIG. 1 shows an electrical junction box 10 in accordance with an embodiment of the invention. The electrical junction box 10 has upper and lower cases 12 and 14 and a printed circuit board 16 that constitutes an internal circuit is accommodated between an upper and lower cases 12 and 14. In the following description, "upper" refers to the side of the upper case 12, and "lower" refers to the side of the lower case 14.

The upper case 12 is molded unitarily of synthetic resin, and has a substantially rectangular box-like shape that opens down. An attachment surface 18 is formed at an upper face of the upper case 12, and a connector insertion hole 20 penetrates the attachment surface 18 at one end of the upper case 12. Bearings 22 are provided outside the attachment surface 18 and on the end opposite the connector insertion hole 20.

The lower case 14 is molded unitarily of synthetic resin. The lower case 14 includes a substantially rectangular plate-shaped bottom wall 24 and a peripheral wall 26 extends up from an outer periphery of the bottom wall 24 to define a substantially box shape that opens up.

The printed circuit board 16 has a rectangular plate shape. Various electrical components, such as relays 28, are provided appropriately on a central portion of the printed circuit board 16. An elongate connector 32 for external connection extends up at an outer peripheral portion 30a along one end of the printed circuit board 16. Furthermore, a lateral connection type connector 34a is disposed at an outer peripheral portion 30b along a side perpendicular to the outer peripheral portion 30a, and a lateral connection type connector 34b is disposed at an outer peripheral portion 30d opposite the outer peripheral portion 30b.

Figure 2:
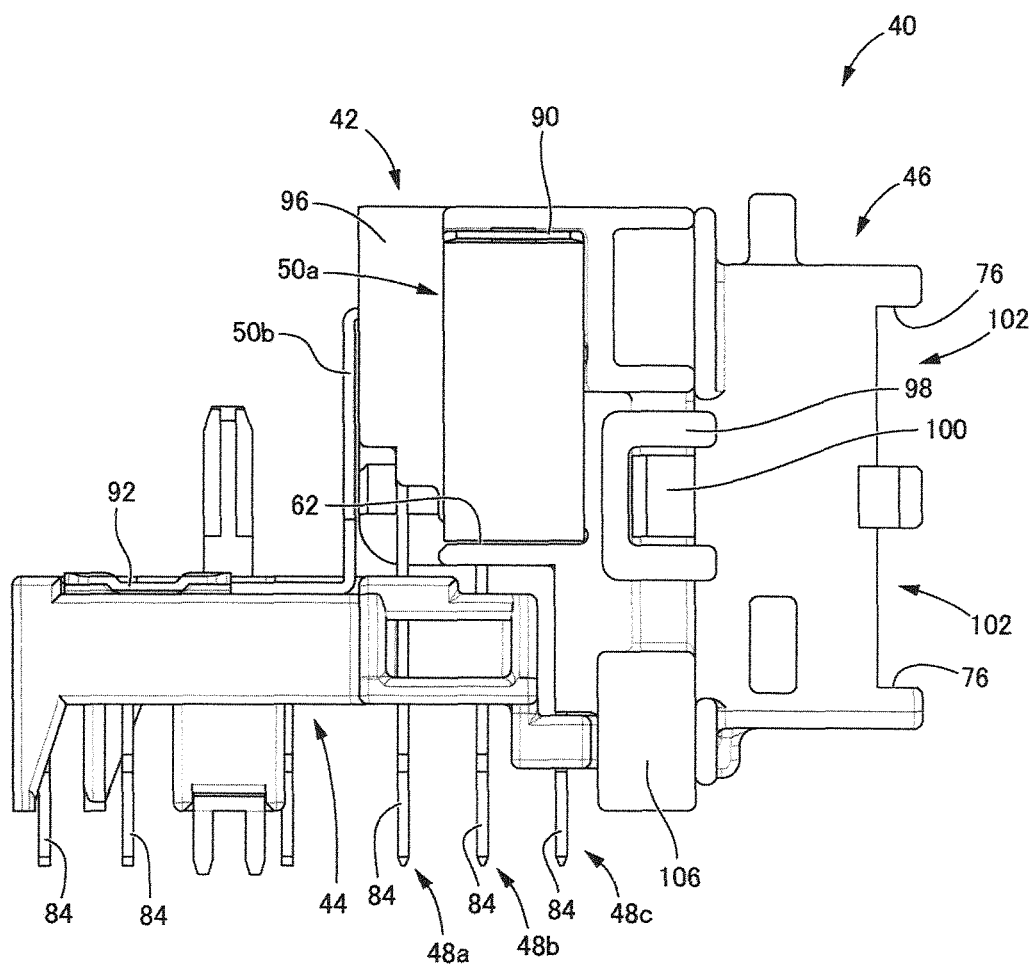
FIG. 2 is a side view of a fuse module in the electrical junction box of FIG. 1.
Figure 3:
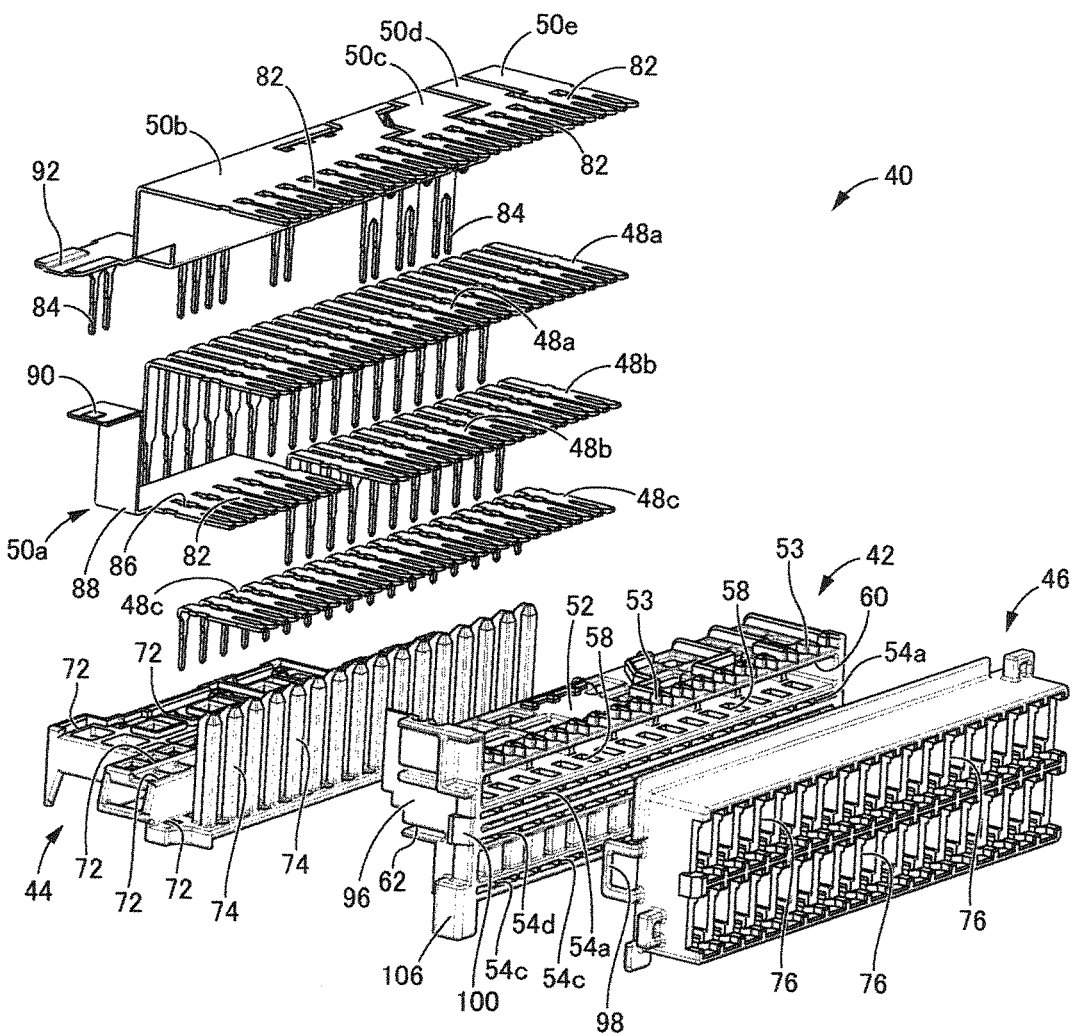
FIG. 3 is an exploded perspective view of the fuse module shown in FIG. 2.

A fuse module 40 is provided at an outer peripheral portion 30c on the end of the printed circuit board 16 that is opposite to the connector 32. As shown in FIGS. 2 and 3, the fuse module 40 is assembled from a terminal support block 42, a base 44, a fuse case 46, a plurality of connecting terminals 48a to 48c, and busbars 50a to 50e.

Figure 4:
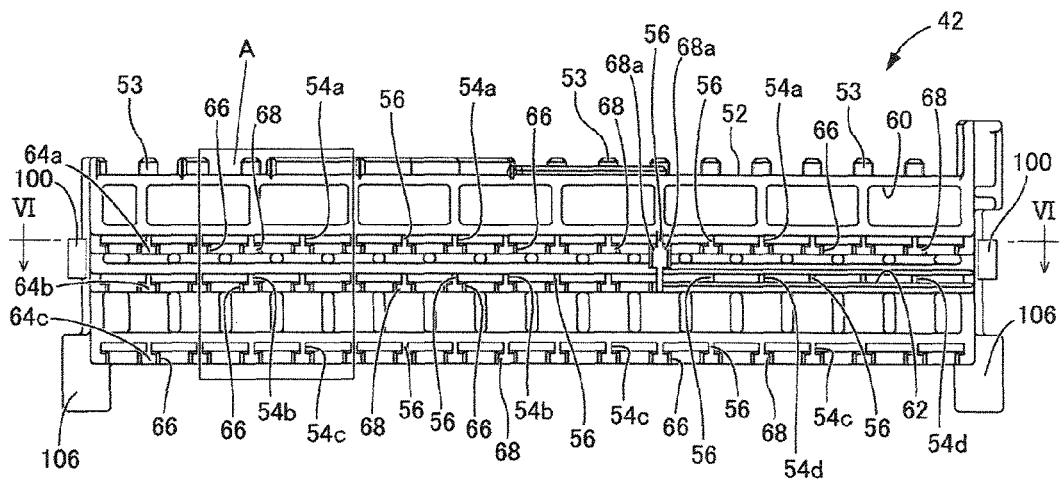
FIG. 4 is a rear view of a terminal support block of the fuse module of FIG. 2.
Figure 5:
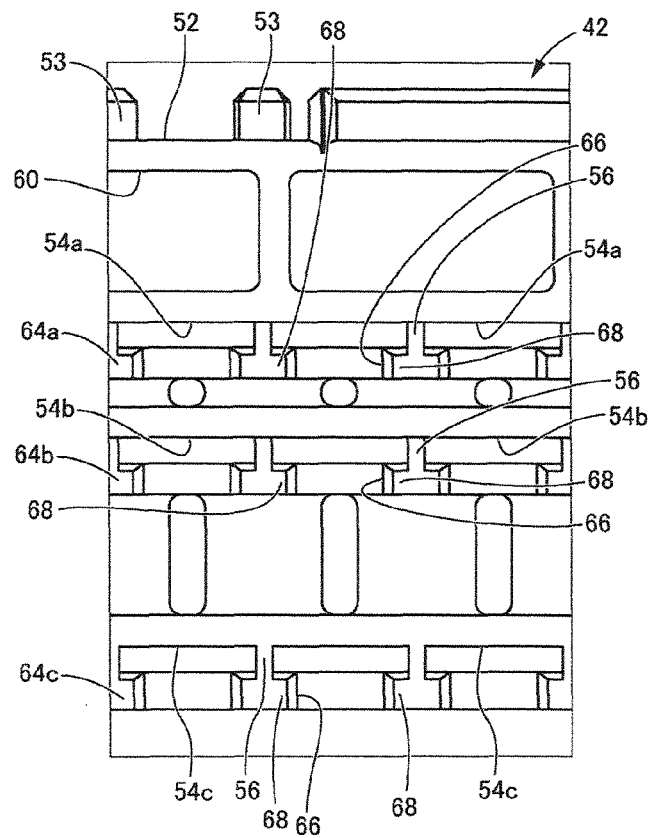
FIG. 5 is an enlarged view of portion A in FIG. 4.
Figure 6:
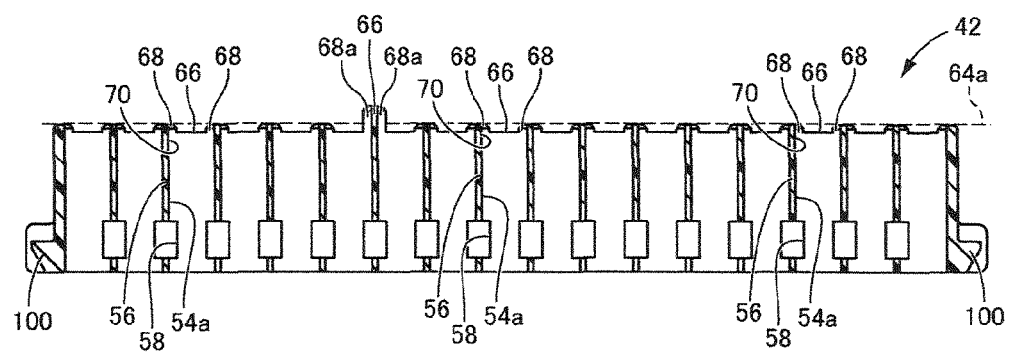
FIG. 6 is a cross-sectional view taken along line VI-VI in FIG. 4.

The terminal support block 42 is molded unitarily of a synthetic resin and has a substantially elongated block-like shape, as shown in FIGS. 4 to 6. A plurality of support projections 53 are formed on an end edge portion of an upper face 52 of the terminal support block 42 on the side of the fuse case 46 and are arranged at predetermined intervals in a longitudinal direction of the terminal support block 42. Three tiers of terminal insertion holes 54a to 54c are formed in the terminal support block 42. Each terminal insertion hole 54a to 54c penetrates the terminal support block 42 in a front-rear direction (vertical direction in FIG. 6). The terminal insertion holes 54a to 54c in each tier are arranged side by side in the longitudinal direction (left-right direction in FIG. 6) of the terminal support block 42 and are separated by partition walls 56.

Pin insertion holes 58 extend vertically between longitudinally adjacent terminal insertion holes 54a to 54c in each tier and open at the upper end of the respective partition walls 56. Thus, the pin insertion holes 58 are arranged side by side in the longitudinal direction of the terminal support block 42 at predetermined intervals. An empty space 60 extends in the longitudinal direction of the terminal support block 42 at a position above the terminal insertion holes 54a in the upper tier. The empty space 60 opens forward (down in FIG. 6), and upper ends of the pin insertion holes 58 open into the empty space 60.

The terminal insertion holes 54a to 54c in each tier define a linear array and the three tiers of terminal insertion holes 54a to 54c are substantially parallel. The terminal insertion holes 54c in the lower tier and the terminal insertion holes 54b in the middle tier define vertically opposed pairs that are spaced vertically from one another by distances corresponding to distances between connecting terminals of a fuse, which is not shown.

A bus bar insertion slit 62 is formed in one longitudinal end (right end in FIG. 4) of the terminal support block 42 and on the same straight line as the middle tier of terminal insertion holes 54b. The bus bar insertion slit 62 opens to the rear side of the terminal support block 42. Moreover, a front portion of the interior of the bus bar insertion slit 62 is divided by a plurality of partition walls 56 in the longitudinal direction of the terminal support block 42 to form a plurality of terminal insertion holes 54d that are arranged side by side. Thus, the middle tier of the terminal support block 42 has the terminal insertion holes 54b and the terminal insertion holes 54d formed side by side on the same straight line at equal intervals. The terminal insertion holes 54c in the lower tier that are on the one end of the terminal support block 42 in the longitudinal direction (right end in FIG. 4) are in positions opposing the terminal insertion holes 54d within the bus bar insertion slit 62.

The distance by which the terminal support block 42 protrudes rearward (up in FIG. 6) gradually increases from the terminal insertion holes 54c in the lower tier to the terminal insertion holes 54a in the upper tier. Thus, the opening end faces 64a of the terminal insertion holes 54a on the side (left side in FIG. 2) that receives the connecting terminals 48a are in a rearmost position in the front-rear direction (left-right direction in FIG. 2) of the terminal support block 42, and the opening end face 64c of the terminal insertion holes 54c on the side (left side in FIG. 2) that receives the connecting terminals 48c are in the foremost position. As shown in FIG. 6, almost all of each of the opening end faces 64a to 64c defines a single plane extending in the longitudinal direction (left-right direction in FIG. 6) of the terminal support block 42.

Fitting recesses 66 are formed in the opening end faces 64a to 64c directly below each of the terminal insertion holes 54a to 54c. The fitting recesses 66 are recessed from the opening end faces 64a to 64c toward the front (the lower side in FIG. 6) of the terminal support block 42. Additionally, the fitting recesses 66 are narrower than the terminal insertion holes 54a to 54c in the left-right direction in FIG. 6 and have centers in the width direction coinciding with the center of the respective terminal insertion holes 54a to 54c in the width direction.

Temporal retaining portions 68 are formed on opposite sides of each fitting recess 66 in the width direction and protrude rearward (up in FIG. 6) by a relatively large distance. The temporal retaining portions 68 are directly below respective rear openings 70 of the terminal insertion holes 54a to 54c on the side on which the connecting terminals 48a to 48c are inserted, and in opposite end sides of the rear openings 70 in the width direction. Thus, two temporal retaining portions 68 are provided for each pair of longitudinally adjacent terminal insertion holes 54a, 54b, and 54c, and protrude from opposite sides of the partition wall 56 in the longitudinal direction of the terminal support block 42 and are joined together. Peripheral edges of the respective temporal retaining portions 68 on the sides of the terminal insertion holes 54a to 54c and the fitting recesses 66 are tapered to facilitate insertion of the connecting terminals 48a to 48c into the terminal insertion holes 54a to 54c and the fitting recesses 66, as described below. Rearward protruding end faces of the respective temporal retaining portions 68 are flush with the opening end faces 64a to 64c of the terminal insertion holes 54a to 54c. However, one pair of temporal retaining portions 68a that is joined to a specific partition wall 56 located between the bus bar insertion slit 62 and the terminal insertion holes 54b protrudes rearward by a slightly greater distance.

As shown in FIGS. 2 and 3, the base 44 is molded unitarily of a synthetic resin. The base 44 is substantially rectangular with a longitudinal dimension substantially equal to the longitudinal dimension of the terminal support block 42 and a predetermined width. Through holes 72 penetrate the base 44 in the vertical direction. Support pins 74 protrude up from an end edge of the base 44 on the side of the fuse case 46 and are at predetermined intervals in the longitudinal direction of the base member 44 corresponding respectively with the pin insertion holes 58 of the terminal support block 42.

The fuse case 46 is molded unitarily of synthetic resin and has a plurality of fuse accommodating portions 76 formed therein. The fuse accommodating portions 76 are formed in two tiers in the vertical direction, and in each tier has the fuse accommodating portions 76 are arranged side by side in the longitudinal direction of the fuse case 46. Each fuse accommodating portion 76 is a substantially rectangular recess that opens to the side of the fuse case 46 that is opposite to the terminal support block 42, and terminal insertion holes are formed in both upper and lower end portions thereof.

Figure 7:
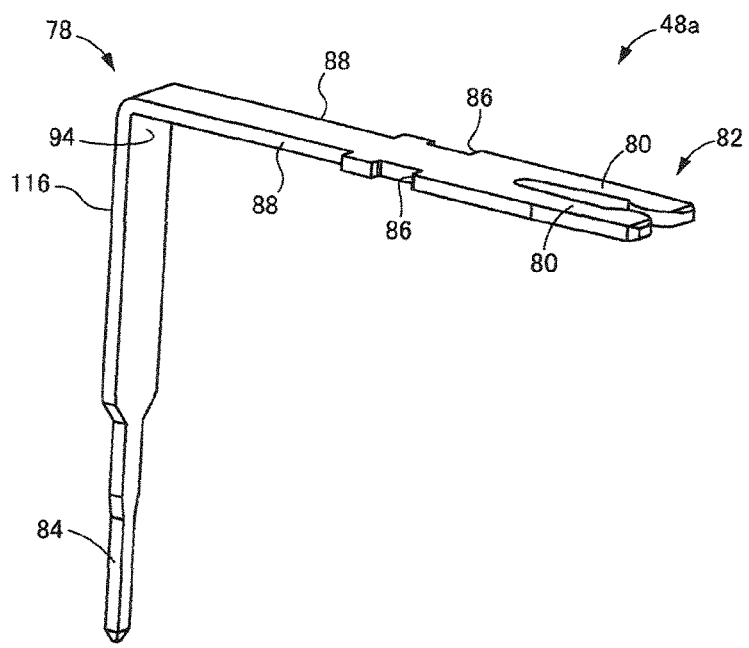
FIG. 7 is a perspective view of a connecting terminal.
Figure 8:
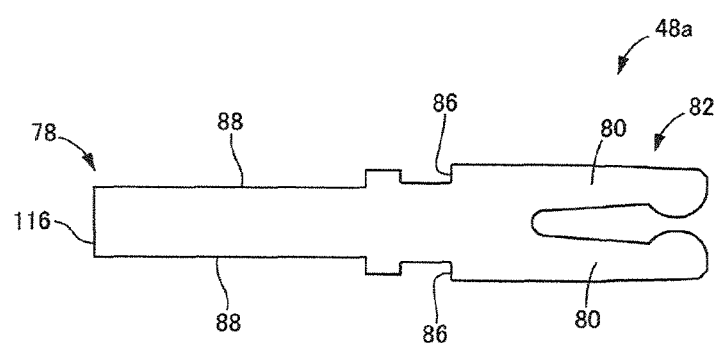
FIG. 8 is a top view of the connecting terminal.

All of the connecting terminals 48a to 48c have substantially the same shape. As shown in FIGS. 7 and 8, the connecting terminal 48a is formed by punching a metal plate and has a bend 78 to define an L shape. Two opposed pressure-contact blades 80 are formed at one end of each of the connecting terminals 48a to 48c to define a connecting portion 82. The pressure-contact blades 80 will sandwich a connecting terminal of a fuse, which is not shown. A soldering portion 84 is formed at the other end portion of each of the connecting terminals 48a to 48c and will be inserted into and soldered to a through hole of the printed circuit board 16. Locking notches 86 are formed at opposite side edges in the width direction (vertical direction in FIG. 8) between the connecting portion 82 and the bend 78. Furthermore, recesses 88 formed at opposite side edges of the bend 78 in the width direction (vertical direction in FIG. 8) and extend in the extending direction of each of the connecting terminals 48a to 48c. Thus, the width of each of the connecting terminals 48a to 48c is narrower (in the vertical direction in FIG. 8) at the bend 78 than at the connecting portion 82. The width of each of the connecting terminals 48a to 48c decreases even further from the bend 78 toward the soldering portion 84, and the cross-sectional shape of the soldering portion 84 is substantially square. The distance from the bend 78 to the soldering portion 84 differs among the connecting terminals 48a, 48b, and 48c, and is set to be longest in the connecting terminals 48a and shortest in the connecting terminals 48c.

The busbars 50a to 50e are formed by punching a metal plate and are arranged side by side as shown most clearly in FIG. 3. Connecting portions 82 and locking notches 86 are formed in an end edge of each of the busbars 50a to 50e and are similar to those of the above-described connecting terminals 48a to 48c. A first input terminal 90 is formed unitarily at an end edge of the bus bar 50a that is perpendicular to the edge that has the connecting portions 82 arranged side by side. The first input terminal 90 is an initially flat tab that is bent into an L shape, and protrudes from the busbar 50a perpendicular to the protruding direction of the connecting portions 82. The busbars 50b to 50e each have a crank shape. Soldering portions 84 are formed in an edge opposite the edge with the connecting portions 82 and are similar to the soldering portions of the connecting terminals 48a to 48c. Furthermore, a tab-like second input terminal 92 is formed unitarily with the bus bar 50b and protrudes in the same direction as the first input terminal 90.

Figure 9:
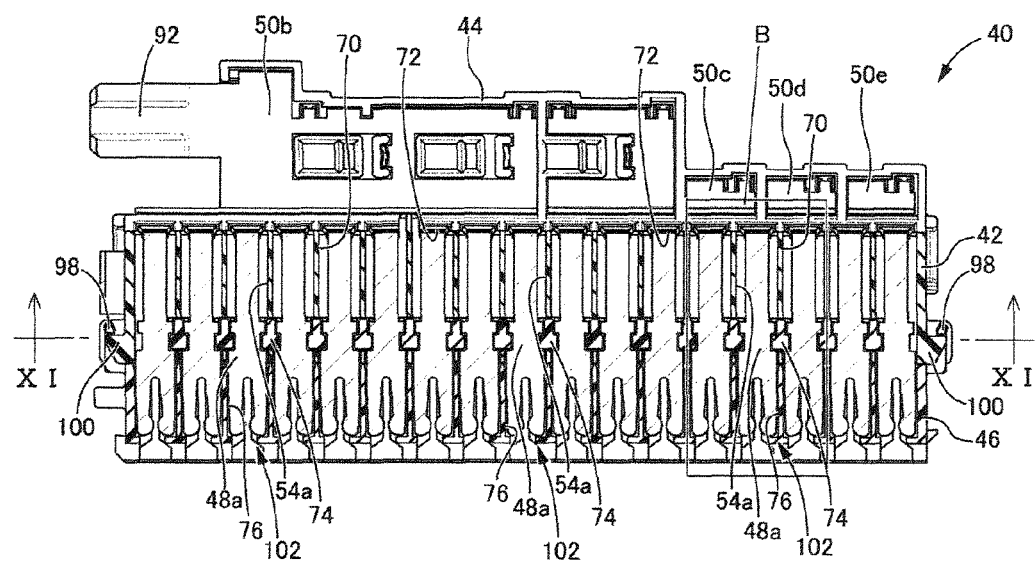
FIG. 9 is a cross-sectional view of the fuse module shown in FIGS. 2 and 3.
Figure 10:
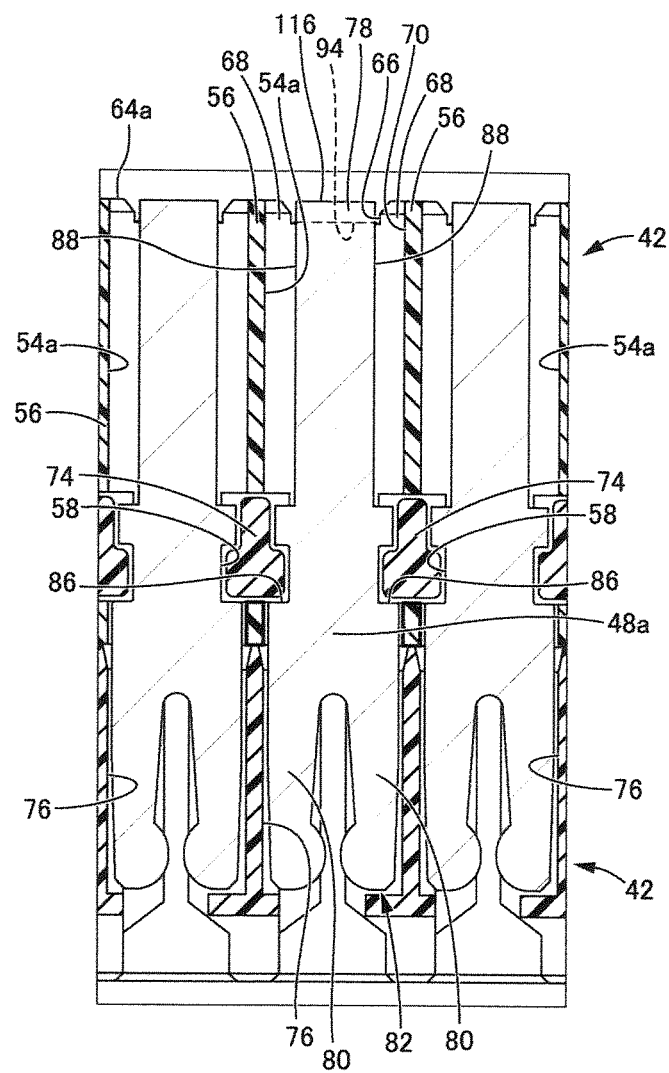
FIG. 10 is an enlarged view of portion B in FIG. 9.

The fuse module 40 is assembled by initially by inserting the connecting portions 82 of the connecting terminals 48a to 48c into the respective terminal insertion holes 54a to 54c of the terminal support block 42 from the rear openings 70, as shown in FIGS. 9 and 10. More particularly, the recesses 88 of each bend 78 are fit between the temporal retaining portions 68. Thus, each of the connecting terminals 48a to 48c is positioned temporarily in a state in which the locking notches 86 align with the corresponding pin insertion holes 58 before the support pins 74 of the base 44 are inserted into the respective pin insertion holes 58 of the terminal support block 42. In this manner, the connecting terminals 48a, 48b, and 48c are supported by the terminal support block 42 in a state in which the connecting portions 82 protrude forward from the terminal support block 42 and are arranged one above another in the vertical direction.

The busbar 50a is inserted into the busbar insertion slit 62 of the terminal support block 42, as shown in FIG. 2. Thus, the connecting portions 82 (see FIG. 3) of the busbar 50a are inserted into the respective terminal insertion holes 54d in the busbar insertion slit 62 and protrude forward from the terminal support block 42 in the same row as the connecting portions 82 of the connecting terminals 48b. The first input terminal 90 of the busbar 50a is on a side face 96 of the terminal support block 42 and protrudes through the busbar insertion slit 62 outward from the terminal support block 42 in the longitudinal direction.

Figure 11:
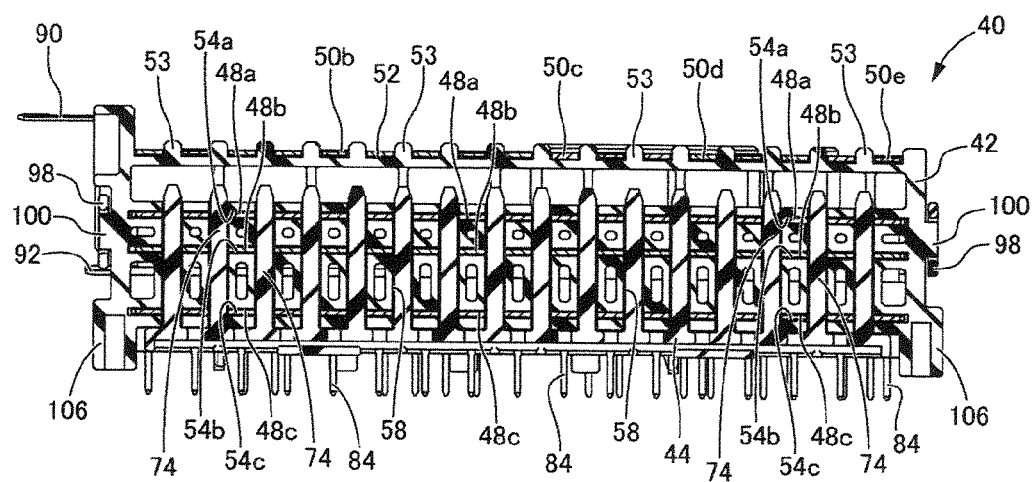
FIG. 11 is a cross-sectional view taken along line XI-XI in FIG. 9.

Next, the terminal support block 42 to which the connecting terminals 48a to 48c and the busbar 50a have been mounted is laid on the base 44, and the support pins 74 of the base 44 are inserted respectively into the corresponding pin insertion holes 58 of the terminal support block 42. Thus, as shown in FIG. 11, the support pins 74 are inserted vertically into the terminal support block 42 and enter the locking notches 86 of longitudinally adjacent connecting terminals 48a, 48b or 48c or the bus bar 50a. As a result, the support pins 74 engage the locking notches 86 of the connecting terminals 48a to 48c to position the connecting terminals 48a to 48c in the respective terminal insertion holes 54a to 54c. Moreover, the soldering portions 84 of the connecting terminals 48a to 48c are inserted into the respective through holes 72 of the base 44 and protrude down from the base 44.

The busbars 50*b* to 50*e* then are laid on the upper face 52 of the terminal support block 42 and an upper face of the base 44. Thus, the support projections 53 formed on the upper face 52 of the terminal support block 42 are inserted between longitudinally adjacent locking notches 86 of the busbars 50*b* to 50*e*. As a result, the support projections 53 engage the locking notches 86 of the busbars 50*b* to 50*e* to support the connecting portions 82 of the busbars 50*b* to 50*e* during insertion/removal of a fuse. Furthermore, the soldering portions 84 of the busbars 50*b* to 50*e* protrude down through the respective through holes 72 of the base 44. Placement of the busbar 50*b* on the base 44 causes the second input terminal 92 to protrude out from the base 44 in the longitudinal direction of the terminal support block 42.

The fuse case 46 then is laid on a front face of the terminal support block 42, and engagement frames 98 formed at opposite longitudinal ends of the fuse case 46 engage engagement claws 100 formed at opposite longitudinal ends of the terminal support block 42. Thus, the connecting portions 82 of the busbars 50*b* to 50*e* and the connecting portions 82 of the connecting terminals 48*a*, which protrude forward from the terminal support block 42, are inserted into the fuse accommodating portions 76 in the upper tier. As a result, a connecting portion 82 of one of the busbars 50*b*, 50*c*, 50*d*, or 50*e* and a corresponding connecting portion 82 of one of the connecting terminals 48*a* are in mutually opposed positions in each of the fuse accommodating portions 76. Similarly, the connecting portions 82 of the connecting terminals 48*b* or the bus bar 50*a* and the connecting portions 82 of the connecting terminals 48*c* are inserted into the fuse accommodating portions 76 in the lower tier in opposed positions. A fuse attachment portion 102 is formed by a fuse accommodating portion 76 and a pair of connecting portions 82 disposed therein. The fuse attachment portions 102 are formed in two tiers in the vertical direction, and each tier has the fuse attachment portions 102 arranged side by side in the longitudinal direction of the fuse module 40. As shown in FIG. 1, a cover 104 can be mounted to the fuse module 40, and covers the openings of the fuse attachment portions 102 to protect the connecting portions 82 within the fuse attachment portions 102.

As shown in FIG. 1, the fuse module 40 having the above-described structure is placed on the outer peripheral portion 30*c* of the printed circuit board 16, and the soldering portions 84 of the connecting terminals 48*a* to 48*c* and the bus bars 50*b* to 50*e* are inserted into and soldered to the respective through holes of the printed circuit board 16. Bolt fixing portions 106 formed at opposite ends of the terminal support block 42 in the longitudinal direction then are fixed to the printed circuit board 16 with bolts (not shown) to fix the fuse module 40 to the outer peripheral portion 30*c* of the printed circuit board 16.

The lateral connection type connector 34*b* is disposed at an outer peripheral portion 30*d* of the printed circuit board 16 that extends perpendicular to the longitudinal direction of the fuse module 40. The lateral connection type connector 34*b* has a housing 108 and first and second connector accommodating portions 110 and 112 are formed unitarily at a longitudinal end of the housing 108 adjacent the fuse module 40. An end of each of the first and second connector accommodating portion 110 and 112 on the side of the fuse module 40 opens up.

The lateral connection type connector 34*b* is mounted to the printed circuit board 16 before mounting the fuse module 40. Thus, the fuse module 40 is mounted from above to the outer peripheral portion 30*c* of the printed circuit board 16 after the lateral connection type connector 34*b* has been mounted so that the first and second input terminals 90 and 92 protruding from the fuse module 40 are inserted into the first and second connector accommodating portions 110 and 112, respectively.

Figure 12:
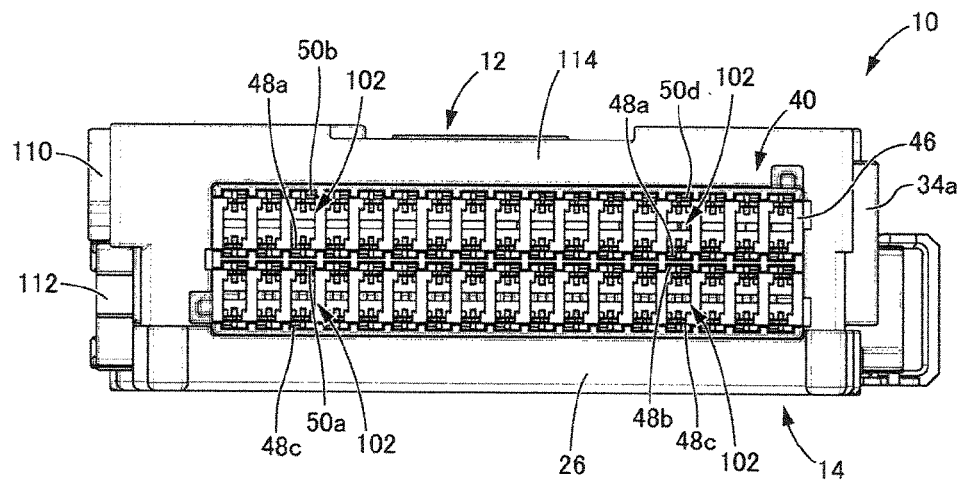
FIG. 12 is a side view of the electrical junction box shown in FIG. 1.

The printed circuit board 16 is accommodated between the upper and lower cases 12 and 14 to configure the electrical junction box 10. In addition, as shown in FIG. 12, the fuse attachment portions 102 of the fuse module 40 open into a side face 114 of the electrical junction box 10 and are arranged side by side in the extending direction (left-right direction in FIG. 12) of the side face 114 in two tiers that are one above the other.

The electrical junction box 10 as described above is disposed, for example, in a compartment of an automobile. A shaft in an external circuit member, such as an ECU unit, which is not shown, is supported by the bearings 22 of the upper case 12, and the external circuit member is rotated on the shaft and superposed on the attachment surface 18. Thus, a connector in the external circuit member is connected to the connector 32 for external connection that protrudes through the connector insertion hole 20 in the attachment surface 18 so that the printed circuit board 16 and the external circuit member are connected to each other. Moreover, connectors, which are not shown, are connected to the lateral connection type connectors 34*a* and 34*b* that open to respective lateral sides of the electrical junction box 10. Furthermore, fuses, which are not shown, are connected respectively to the fuse attachment portions 102 that open into the side face 114 of the electrical junction box 10. The fuses receive power via a connector from a battery that is connected to the first connector accommodating portion 110 or a connector from an alternator that is connected to the second connector accommodating portion 112.

The recesses 88 are formed at the side edges of the bend 78 of each of the connecting terminals 48*a* to 48*c* that are provided in the fuse attachment portions 102 of the electrical junction box 10, and two temporal retaining portions 68 are formed in the rear opening portion 70 of each of the terminal insertion holes 54*a* to 54*c* of the terminal support block 42 that supports the connecting terminals 48*a* to 48*c*. Thus, as shown in FIG. 10, the connecting terminals 48*a* to 48*c* can be positioned at their bends 78 by fitting the recesses 88 of the connecting terminals 48*a* to 48*c* between the temporal retaining portions 68. As a result, the locking notches 86 of the connecting terminals 48*a* to 48*c* are positioned temporarily above the pin insertion holes 58 of the terminal support block 42 before the support pins 74 are inserted so that the support pins 74 can be inserted smoothly.

The bends 78 at the rear ends of the connecting terminals 48*a* to 48*c* in the direction of insertion into the terminal insertion holes 54*a* to 54*c* are positioned temporarily by being fit between the temporal retaining portions 68. Thus, a lateral protrusion in a region spanning from the bend 78 to the connecting portion 82 is not necessary for temporal positioning of the connecting terminals 48*a* to 48*c*. As a result, the width of the connecting terminals 48*a* to 48*c* spanning the region from the bend 78 to the connecting portion 82 can be reduced, so that the connecting terminals 48*a* to 48*c* can be arranged side by side with a narrow pitch in respective rows. Consequently, the fuse attachment portions 102 can be formed side by side with a narrower pitch.

The fitting recesses 66 are formed in the opening end faces 64*a* to 64*c* at the rear end of the terminal insertion holes 54*a* to 54*c* in the insertion direction of the connecting terminals 48*a* to 48*c*. An inner surface 94 of the bend 78 of each connecting terminal 48*a* to 48*c* engages a corresponding fitting recess 66 and an outer surface 116 of the bend 78 of each of the connecting terminals 48*a* to 48*c* in the insertion direction is flush with the opening end faces 64a to 64c of the terminal insertion holes 54a to 54c if the connecting terminals 48a to 48c are inserted to proper positions at which the locking notches 86 are located above the pin insertion holes 58. As a result, the proper temporarily inserted state of the connecting terminals 48a to 48c can be checked based on whether the outer surfaces 116 of the connecting terminals 48a to 48c protrude from the opening end faces 64a to 64c. Thus, the inserted state of the connecting terminals 48a to 48c can be checked easily and quickly even if a large number of connecting terminals 48a to 48c are inserted into the respective terminal insertion holes 54a to 54c.

The locking notches 86 of the connecting terminals 48a to 48c are engaged with the support pins 74 so that the connecting terminals 48a to 48c are supported during insertion/removal of the fuses. In addition, the bends 78 of the connecting terminals 48a to 48c are fit into the respective fitting recesses 66, and the inner surface 94 of each bent portion 78 faces the fitting recess 66. Removal of the fuses exerts a force on the connecting terminals 48a to 48c in a pulling direction (from the upper side to the lower side in FIG. 10). However, the contact between the inner surfaces 94 and the respective fitting recesses 66 lock the connecting terminals 48a to 48c in the terminal support block 42. The engagement of the support pins 74 with the locking notches 86 supports the connecting terminals 48a to 48c more securely in the terminal support block 42 during removal of the fuses, and the fuses can be removed more stably.

Although an embodiment of the invention has been described in detail above, the invention is not limited to the specific descriptions thereof. For example, there is no limitation on the number of fuse attachment portions and the number of tiers of fuse attachment portions, and the fuse attachment portions may also be provided in, for example, three or more tiers placed one above another.

Moreover, the connecting terminals 48a to 48c of the above-described embodiment were configured so that the width of the soldering portions 84 is smaller than the width of the region in which the recesses 88 are formed, but, for example, the recesses may also be formed into a hook-like shape, and in the length direction of each connecting terminal, the width of the connecting terminal may once decrease in the region in which the recessed portions are formed and then increase again.

Furthermore, the invention is not limited to an electrical junction box to which a separate circuit member such as an ECU unit is connected as in the above-described embodiment, and it is also possible to apply the invention to, for example, an electrical junction box in which an attachment portion for an electrical component such as a relay or a connector is provided on the upper face.

What is claimed is:

1. An electrical junction box, comprising:
    a fuse case formed with a plurality of fuse attachment portions arranged side by side and open to a lateral side of the fuse case;
    a terminal support block adjacent the fuse case, a plurality of terminal insertion holes formed side by side in the terminal support block;
    a plurality of connecting terminals mounted in the respective terminal insertion holes and in proximity to the fuse attachment portions, each of connecting terminals having an L-shaped bend, recesses formed at opposite side edges of each of the connecting terminals and extending on both sides of the bend in a length direction of the connecting terminals;
    support pins inserted into the terminal support block and locking the connecting terminals; and
    temporal retaining portions formed at opening ends of the terminal insertion holes of the terminal support block, the recesses of the connecting terminal being fit to the temporal retaining portions for temporarily positioning the connecting terminals within the terminal insertion holes.

2. The electrical junction box of claim 1, wherein an inner surface of the bend of each of the connecting terminals is locked by the terminal support block.

3. The electrical junction box of claim 1, a rear end face of each of the connecting terminals is flush with an opening end face of the terminal insertion holes when the connecting terminals are inserted properly into the respective terminal insertion holes of the terminal support block.

4. The electrical junction box of claim 1, wherein the connecting terminals are formed with locking notches, the support pins engaging the locking notches.

5. The electrical junction box of claim 1, wherein the locking notches extend in directions perpendicular to extending directions of the connecting terminals.

6. The electrical junction box of claim 1, wherein the connecting terminals have connecting portions that protrude forward from the terminal support block and into the fuse accommodating portions.

7. The electrical junction box of claim 1, wherein the connecting terminals are disposed in a plurality of tiers in the terminal support block.

* * * * *